(12) United States Patent
Kuo et al.

(10) Patent No.: US 9,535,092 B2
(45) Date of Patent: Jan. 3, 2017

(54) SPRING PROBE

(71) Applicant: MPI CORPORATION, Chu-Pei, Hsinchu Shien (TW)

(72) Inventors: Ting-Hsin Kuo, Chu-Pei (TW); Tsung-Yi Chen, Chu-Pei (TW); Tien-Chia Li, Chu-Pei (TW); Yi-Lung Lee, Chu-Pei (TW); Chien-Chou Wu, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 10 days.

(21) Appl. No.: 14/605,776

(22) Filed: Jan. 26, 2015

(65) Prior Publication Data

US 2015/0253356 A1 Sep. 10, 2015

Related U.S. Application Data

(60) Provisional application No. 61/932,251, filed on Jan. 28, 2014, provisional application No. 61/943,540, filed on Feb. 24, 2014.

(51) Int. Cl.
*G01R 1/067* (2006.01)
*G01R 1/073* (2006.01)

(52) U.S. Cl.
CPC ....... *G01R 1/06722* (2013.01); *G01R 1/07307* (2013.01)

(58) Field of Classification Search
CPC ............ G01R 1/06722; G01R 1/07307; G01R 1/06716
USPC .................................................... 324/755.05
See application file for complete search history.

(56) References Cited

U.S. PATENT DOCUMENTS

| | | | | |
|---|---|---|---|---|
| 5,982,187 A | * | 11/1999 | Tarzwell | ............ G01R 1/06722 324/72.5 |
| 6,720,511 B2 | * | 4/2004 | Windebank | ............ H01H 1/245 200/275 |
| 2012/0071037 A1 | * | 3/2012 | Balucani | ............ G01R 1/06716 439/851 |

(Continued)

FOREIGN PATENT DOCUMENTS

| JP | H06-094749 A | 4/1994 |
|---|---|---|
| JP | 2004-152495 A | 5/2004 |

(Continued)

*Primary Examiner* — Daniel Miller
(74) *Attorney, Agent, or Firm* — Muncy, Geissler, Olds & Lowe, P.C.

(57) ABSTRACT

A spring probe includes a needle, a spring sleeve sleeved onto the needle, and a protrusion. The spring sleeve has upper and lower non-spring sections, and at least a spring section therebetween. The needle has a bottom end portion protruding out from the lower non-spring section, and a top end portion located in the upper non-spring section. The protrusion is located at one of the top end portion and the upper non-spring section. The needle is movable relative to the upper non-spring section from an initial position to a connected position where the upper non-spring section is electrically connected with the needle through the protrusion when receiving an external force. As a result, the spring probe effectively prevents signals from being transmitted through the spring section, thereby improving stability of signal transmission and preventing the spring section from fracture.

13 Claims, 10 Drawing Sheets

(56) References Cited

U.S. PATENT DOCUMENTS

| | | | |
|---|---|---|---|
| 2013/0057308 A1* | 3/2013 | Yano ........................ | G01R 3/00 324/755.01 |
| 2013/0057309 A1* | 3/2013 | Kojima .................... | C25D 1/02 324/755.05 |

FOREIGN PATENT DOCUMENTS

| | | |
|---|---|---|
| JP | 2010-151732 A | 7/2010 |
| JP | 2010-281592 A | 12/2010 |
| JP | WO2011/078176 A | 6/2011 |
| JP | 2012-088298 A | 5/2012 |
| TW | 378757 | 1/2000 |

\* cited by examiner

SPRING PROBE

BACKGROUND OF THE INVENTION

1. Field of the Invention

The present invention relates generally to probes for probe cards and more particularly, to a spring probe.

2. Description of the Related Art

Upon testing semiconductor chips, a tester is electrically connected with devices under test (hereinafter referred to as the "DUTs") through a probe card, so that the tester can obtain the testing results of the DUTs by means of signal transmission and analysis. The conventional probe card is usually composed of a circuit board and a probe device, or further comprises a space transformer disposed between the circuit board and the probe device. The probe device has a plurality of probes arranged corresponding to contact pads of the DUTs, so that the contact pads can be probed by the probes at the same time.

FIG. 1 is an exploded plan view of a conventional spring probe 11 which comprises a needle 12, and a spring sleeve 13 sleeved onto the needle 12. FIG. 2 is a schematic sectional view of a probe card 14 using the spring probe 11. For the convenience of illustration, FIG. 2 is not drawn to the same scale with FIG. 1. The probe card 14 comprises a circuit board 15 and a probe device 16 having a probe seat 17 and a plurality of probes 11. For the convenience of illustration, only a small part of the circuit board 15 and the probe seat 17 and one of the probes 11 are shown in FIG. 2.

The needle 12 and the spring sleeve 13 of the probe 11 are connected in a way that a connection section 132, which is provided near the bottom end of the spring sleeve 13, is pressed against the needle 12 and fixed to the needle 12 by welding, such as spot welding. The probe seat 17 is composed of upper, middle and lower dies 171, 172, 173; however, the probe seat 17 may be provided without such middle die 172 but composed of the upper and lower dies 171, 173 only. The probe seat 17 has a plurality of installing holes 174 provided in the assembly of the dies 171, 172, 173 (only one of the installing holes 174 is shown in FIG. 2). Each installing hole 174 is composed of an upper guiding hole 171a of the upper die 171, a middle guiding hole 172a of the middle die 172, and a lower guiding hole 173a of the lower die 173, and adapted for accommodating therein a probe 11. The probe 11 is installed in the probe seat 17 in a way that the connection section 132 of the spring sleeve 13 is orientated toward the upper die 171, and thereafter passes through the upper guiding hole 171a and the middle guiding hole 172a in order, and then the connection section 132 is eventually located in the lower guiding hole 173a of the lower die 173 in a way that a bottom section of the needle 12 is inserted through a through hole 173b of the lower die 173 and protrudes out of the lower die 173. By this way, a bottom surface of the connection section 132 of the probe 11 is supported on a bottom surface of the lower guiding hole 173a of the lower die 173. As a result, the probe 11 is kept in the upper, middle and lower dies 171, 172, 173 and prevented from escape from the probe seat 17.

After the probe device 16 is assembled completely, the circuit board 15 is disposed on the top surface 175 of the probe seat 17. The top end of the spring sleeve 13 is electrically connected with a contact pad of the circuit board 15. The bottom end of the needle 12 is adapted to probe a contact pad of the DUT. Specifically speaking, the top end of the spring sleeve 13 is abutted against the circuit board 15, and the spring sleeve 13 is provided with two spring sections 138 which are compressible elastically; besides, the connection section 132 of the spring sleeve 13 is fixed to the bottom section of the needle 12, and a clearance 18 is provided between the top end of the needle 12 and the circuit board 15, i.e. between the top end of the needle 12 and the top end of the spring sleeve 13. Therefore, when the bottom end of the needle 12 contacts the contact pad of the DUT and correspondingly feeds forward, the needle 12 will retract backward, such that the sleeve 13 will be compressed. In this way, the probe 11 can positively contact and electrically connect the contact pad of the DUT; besides, by means of the cushioning effect provided by the spring sleeve 13, an exceeding contact force, which may cause damage or heavy wear of the contact pad of the DUT or the needle, can be prevented.

When the circuit board 15 is electrically connected with a tester (not shown) and the contact pad of the DUT is probed by the bottom end of the needle 12, testing signals can be transmitted between the tester and the DUT through the spring sleeve 13 and the needle 12. Specifically speaking, it is optimal that the needle 12, rather than the spring sleeve 13, is the primary element of the probe 11 used for transmitting the testing signals, and the tail 122 of the needle 12 shall be in contact with the non-spring section 139 provided at the top of the spring sleeve 13, so that the signal transmission between the needle 12 and the spring sleeve 13 occurs at the non-spring section 139. For example, after the signal is transmitted from the DUT to the bottom end of the needle 12, it is optimal that the signal is transmitted to the tail 122 of the needle 12 through the body of the needle 12 itself and then transmitted to the circuit board 15 through the non-spring section 139 at the top of the spring sleeve 13.

However, it is not ensured that the tail 122 of the needle 12 of the conventional spring probe 11 can be in contact with the non-spring section 139 at the top of the spring sleeve 13. Therefore, the testing signals are likely transmitted between the connection section 132 and the needle 12 and transmitted through the spring sections 138, resulting in unstable signal transmission. Besides, because the spring sections 138 have small cross section area, they are unable to bear large electric current. Therefore, the spring sections 138 tend to fracture due to overload of electric current when signals are transmitted therethrough. In addition, because the spring sections 138 have relatively longer path for signal transmission, the spring sections 138 may have great inductance, such that the transmitting bandwidth of the signals passing through the spring sections can hardly be improved. As a result, the conventional spring probe 11 is unsuitable for high frequency testing.

SUMMARY OF THE INVENTION

The present invention has been accomplished in view of the above-noted circumstances. It is an objective of the present invention to provide a spring probe, which can effectively prevent signals from being transmitted through the spring section of the spring sleeve, thereby improving the stability of signal transmission and preventing the spring section of the spring sleeve from fracture.

To attain the above objective, the present invention provides a spring probe which comprises a needle, a spring sleeve, and a protrusion. The needle is provided with a top end portion and a bottom end portion. The spring sleeve is sleeved onto the needle and provided with an upper non-spring section, a lower non-spring section fixed to the needle, and at least a spring section located between the upper non-spring section and the lower non-spring section. The bottom end portion of the needle protrudes out of the spring sleeve from the lower non-spring section. The top end portion of the needle is located in the upper non-spring section. The protrusion is located at one of the top end portion of the needle and the upper non-spring section of the spring sleeve. The needle is movable relative to the upper non-spring section of the spring sleeve from an initial position to a connected position when receiving an external force. When the needle is located at the connected position, the upper non-spring section is electrically connected with the top end portion of the needle through the protrusion.

As a result, when a DUT is probed by the bottom end portion of the needle, the needle is forced to move to the connected position. In this situation, the top end portion of the needle is positively and electrically connected with the upper non-spring section through the protrusion, thereby effectively preventing signals from being transmitted through the spring section of the spring sleeve. This design improves the stability of signal transmission of the spring probe and prevents the spring section of the spring sleeve from fracture.

Preferably, the upper non-spring section of the spring sleeve has an inner surface facing the needle; the protrusion may be protruded from the inner surface.

Preferably, the protrusion may have a guiding slope which is inclined relative to the inner surface of the upper non-spring section and faces the needle, such that the needle can move along the guiding slope in the process of moving from the initial position to the connected position. Besides, the top end portion of the needle may have a chamfering facing the protrusion. In this way, the guiding slope and the chamfering can not only prevent the needle from getting stuck in the beginning of being abutted against the protrusion to an extent that the need is not able to move to the connected position, but also ensure the needle and the protrusion to be in contact with each other reliably.

Preferably, the protrusion may have an engagement surface which is distanced from the inner surface of the upper non-spring section and faces the inner surface; the needle has an outer circumferential surface facing the spring sleeve; when the needle is located at the connected position, the outer circumferential surface of the needle is in contact with the engagement surface and the inner surface of the upper non-spring section. Alternately, the protrusion may be ring-shaped; the needle has an outer circumferential surface facing the spring sleeve; when the needle is located at the connected position, the protrusion surrounds the top end portion of the needle and contacts the outer circumferential surface of the needle. In this way, when the needle is located at the connected position, a large area thereof is in contact with the protrusion, so that the needle is electrically connected with the upper non-spring section more reliably.

Preferably, the upper non-spring section may have a groove penetrating through the inner surface and an outer surface of the upper non-spring section, and an elastic piece resulted from the groove and extended into the upper non-spring section to serve as the protrusion. In this way, the spring probe is more easily made.

Alternately, the needle has an outer circumferential surface facing the spring sleeve; the protrusion may be protruded from the outer circumferential surface.

Preferably, the upper non-spring section of the spring sleeve has an inner surface facing the needle; the protrusion may have an engagement surface facing the spring sleeve, and a guiding slope connected with the engagement surface and inclined relative to the engagement surface; when the needle is located at the connected position, the engagement surface of the protrusion is in contact with the inner surface of the upper non-spring section and the guiding slope is located in the upper non-spring section. In this way, the guiding slope can prevent the protrusion from getting stuck when the protrusion enters into the upper non-spring section.

Preferably, the top end portion of the needle may be surrounded by the protrusion. In this way, when the needle is located at the connected position, a large area of the protrusion is in contact with the upper non-spring section, so that the needle is electrically connected with the upper non-spring section more reliably.

No matter the protrusion is provided at the top end portion of the needle or the upper non-spring section of the spring sleeve, the spring probe may further comprise an insulated layer located between the lower non-spring section of the spring sleeve and the needle, and provided at one of an outer circumferential surface of the needle, which faces the spring sleeve, and an inner surface of the lower non-spring section, which faces the needle. In this way, the insulated layer can prevent signals from being transmitted between the lower non-spring section and the needle, so that the spring probe can more effectively prevent signals from being transmitted through the spring section of the spring sleeve, thereby further improving the stability of signal transmission.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
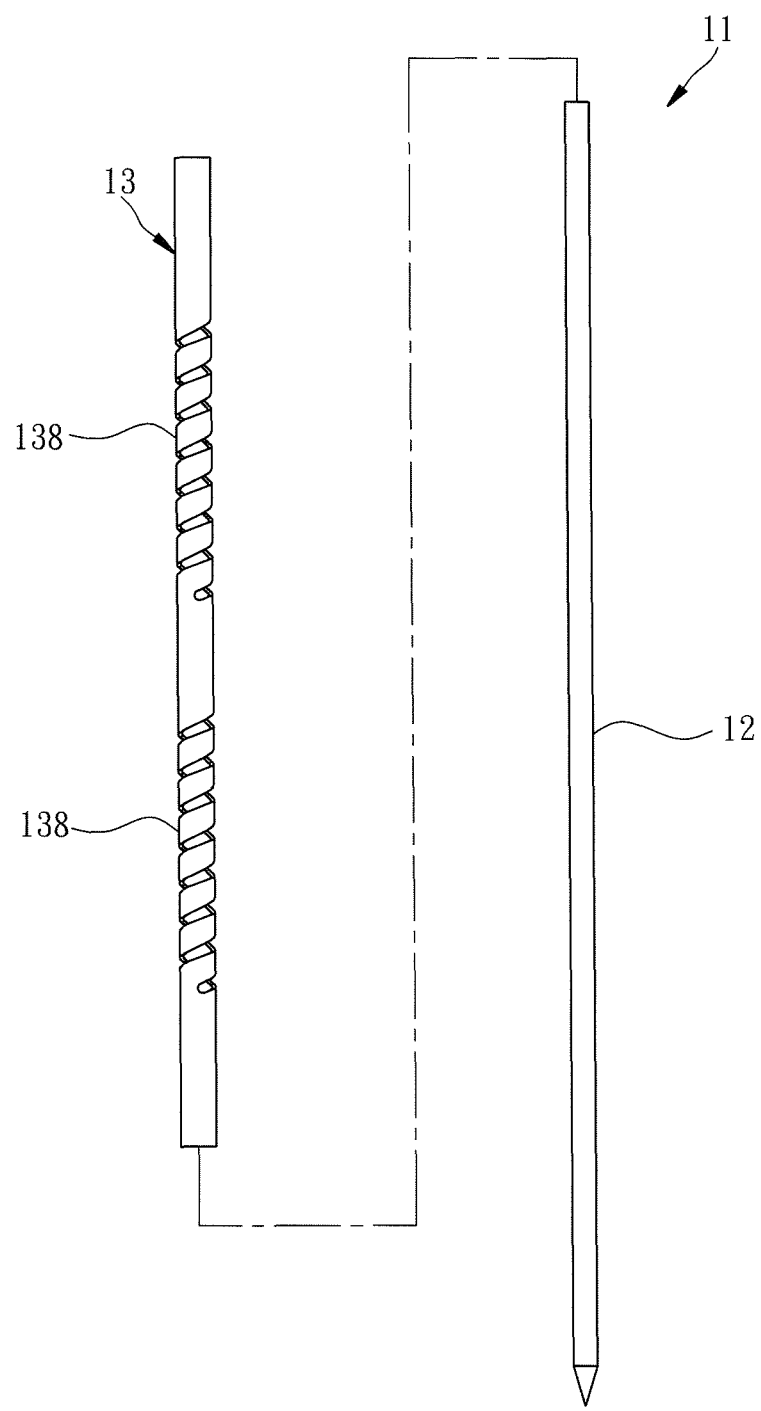
FIG. 1 is an exploded planar view of a conventional spring probe.

First of all, it is to be mentioned that same reference numerals used in the following preferred embodiments and the appendix drawings designate same or similar elements throughout the specification for the purpose of concise illustration of the present invention. Besides, the drawings of the following embodiments are provided only for the convenience of illustrating the technical features of the present invention, and therefore not drawn to the real scale.

Figure 3:
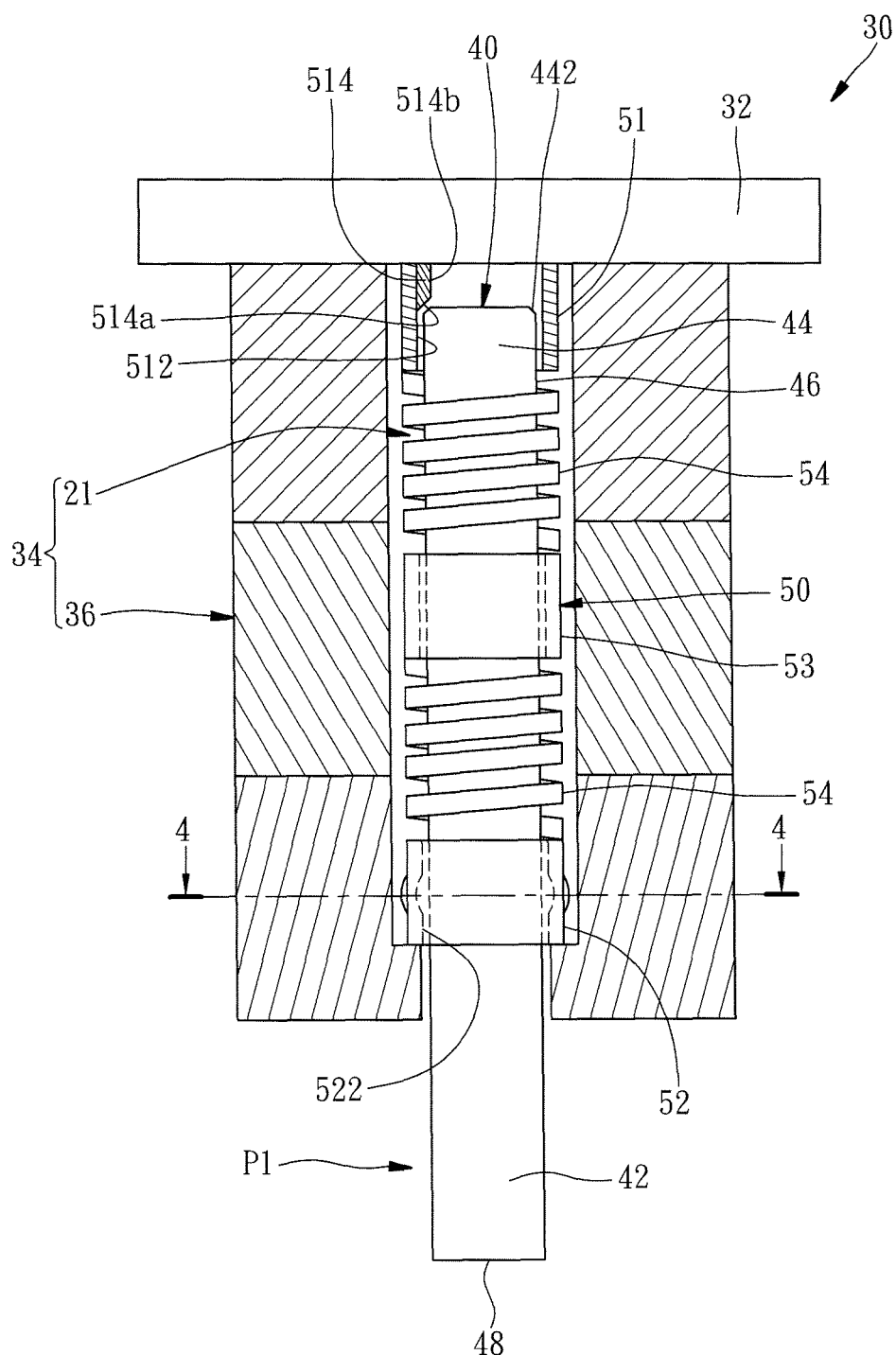
FIG. 3 is a schematic sectional view of a probe card having a spring probe according to a first preferred embodiment of the present invention, showing a status that a needle of the spring probe is located at an initial position.

Referring to FIG. 3, a spring probe 21 according to a first preferred embodiment of the present invention is adapted for being used in a probe card 30 which comprises a circuit board 32 and a probe device 34. The probe device 34 comprises a probe seat 36, and the spring probe 21 installed in the probe seat 36. The amount of the spring probes 21 that are installed in the probe seat 36 of the probe device 34 is unlimited. The circuit board 32 and the probe seat 36 are the same with that of the conventional probe card and therefore will not be specified in the following contents. In practice, the probe device 34 may contain many probes 21. For the convenience of illustration, only a small part of the probe seat 36 and one of the probes 21 are shown in the drawings of this embodiment and the following embodiments.

The spring probe 21 comprises an electricity-conductive needle 40 shaped like a solid straight cylinder, and an electricity-conductive spring sleeve 50 sleeved onto the needle 40. The spring sleeve 50 has an upper non-spring section 51, a lower non-spring section 52, and a middle non-spring section 53 and two spring sections 54, which are located between the upper non-spring section 51 and the lower non-spring section 52. The spring section 54 is opened helically and the amount thereof is unlimited. The middle non-spring section 53 is located between two spring sections 54 and the amount thereof depends on the amount of the spring sections 54. If the probe 21 has only a single spring section 54, it will have no such middle non-spring section 53.

In this embodiment, the needle 40 is shaped like a cylinder. However, the shape of the needle 40 is not limited to the cylinder. For example, the needle 40 may be made as an elongated rectangular column by micro-electro-mechanical systems (MEMS) manufacturing process. The spring sleeve 50 is made of a circular metal pipe with uniform diameter by photolithography techniques. In addition, an electricity-conductive block is provided on an inner surface 512 of the upper non-spring section 51, which faces the needle 40, so that the upper non-spring section 51 has a protrusion 514 protruded from the inner surface 512. Therefore, before the spring sleeve 50 is fixed to the needle 40, the non-spring sections 51, 52, 53 are approximately shaped as straight circular pipes with uniform diameter, except that the upper non-spring section 51 has the protrusion 514. After the spring sleeve 50 is sleeved onto the needle 40, the lower non-spring 52 is pressed against the needle 40 and fixed to the needle 40 by welding. The needle 40 has a bottom end portion 42 protruding out of the spring sleeve 50 from the lower non-spring section 52, and a top end portion 44 located in the upper non-spring section 51.

Figure 4:
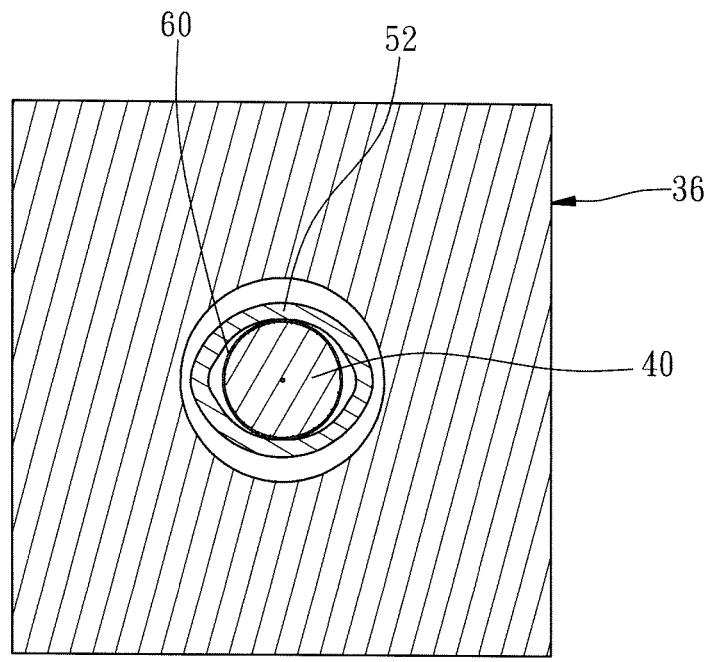
FIG. 4 is a sectional view taken along the line 4-4 in FIG. 3, showing a condition that an insulated layer of the spring probe is coated on the needle.
Figure 5:
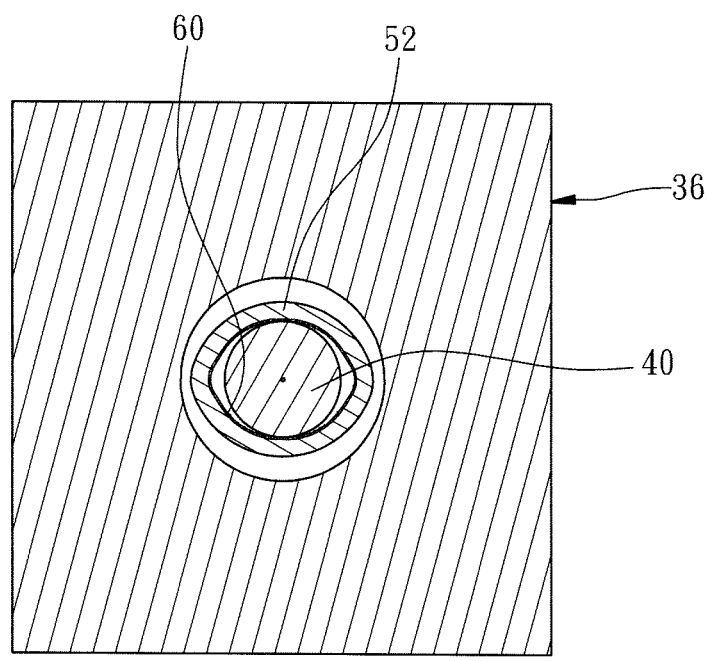
FIG. 5 is similar to FIG. 4, but showing another condition that the insulated layer of the spring probe is coated on a spring sleeve.

Resulted from the aforesaid press fixing process, the lower non-spring section 52 is a little flattened and deformed from the original shape of circular ring having circular cross-sections to the shape of approximate elliptic ring having ellipse-like cross-sections, as shown in FIGS. 4-5. The spring probe 21 may, but not limited to, further comprise an insulated layer 60 located between the lower non-spring section 52 of the spring sleeve 50 and the needle 40 to insulate the lower non-spring section 52 from the needle 40. As shown in FIG. 4, the insulated layer 60 may be coated on an outer circumferential surface 46 (denoted in FIG. 3) of the needle 40, which faces the spring sleeve 50. Alternately, as shown in FIG. 5, the insulated layer 60 may be coated on an inner surface 522 (denoted in FIG. 3) of the lower non-spring section 52, which faces the needle 40.

Figure 2:
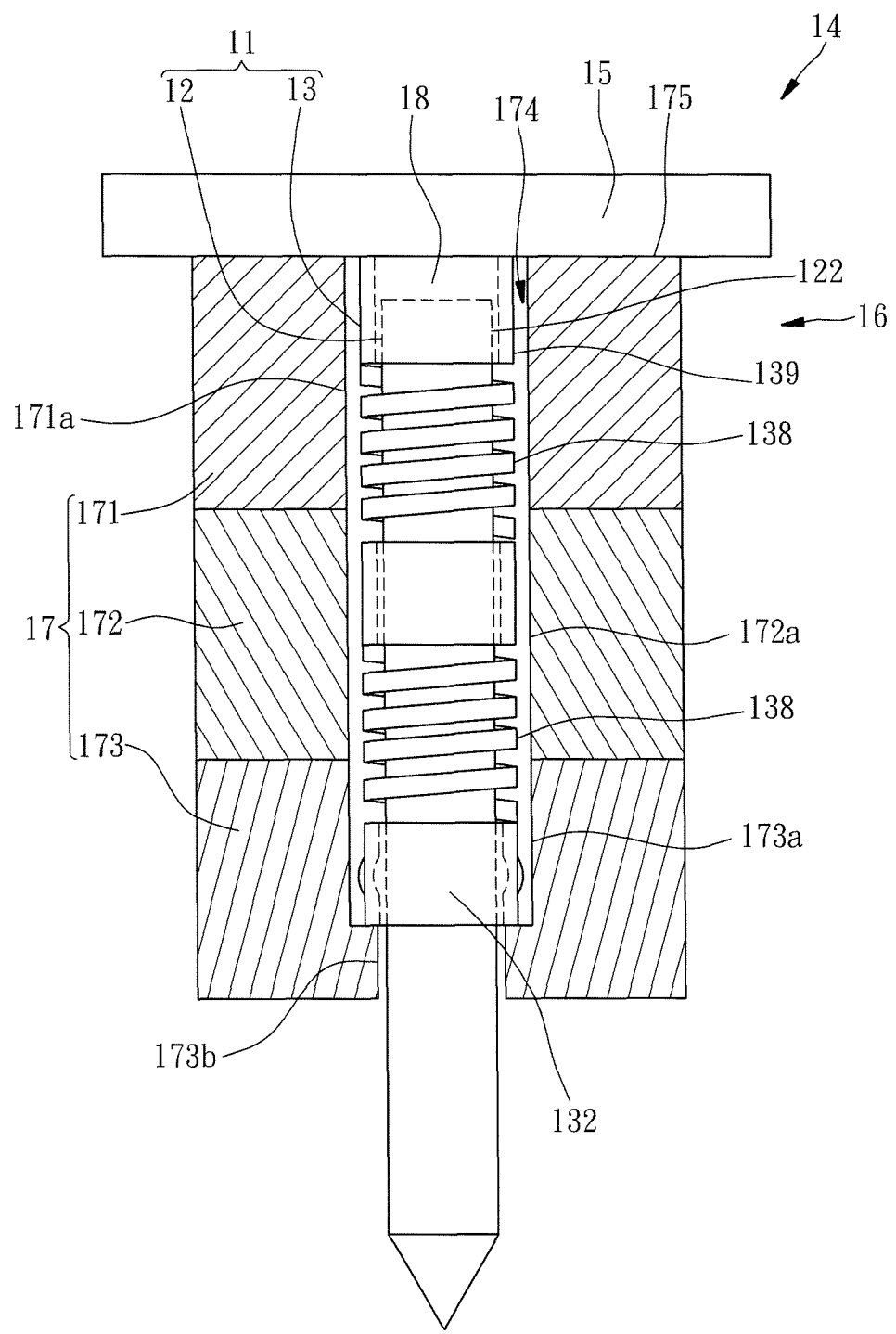
FIG. 2 is a schematic sectional view of a conventional probe card using the spring probe as shown in FIG. 1.
Figure 6:
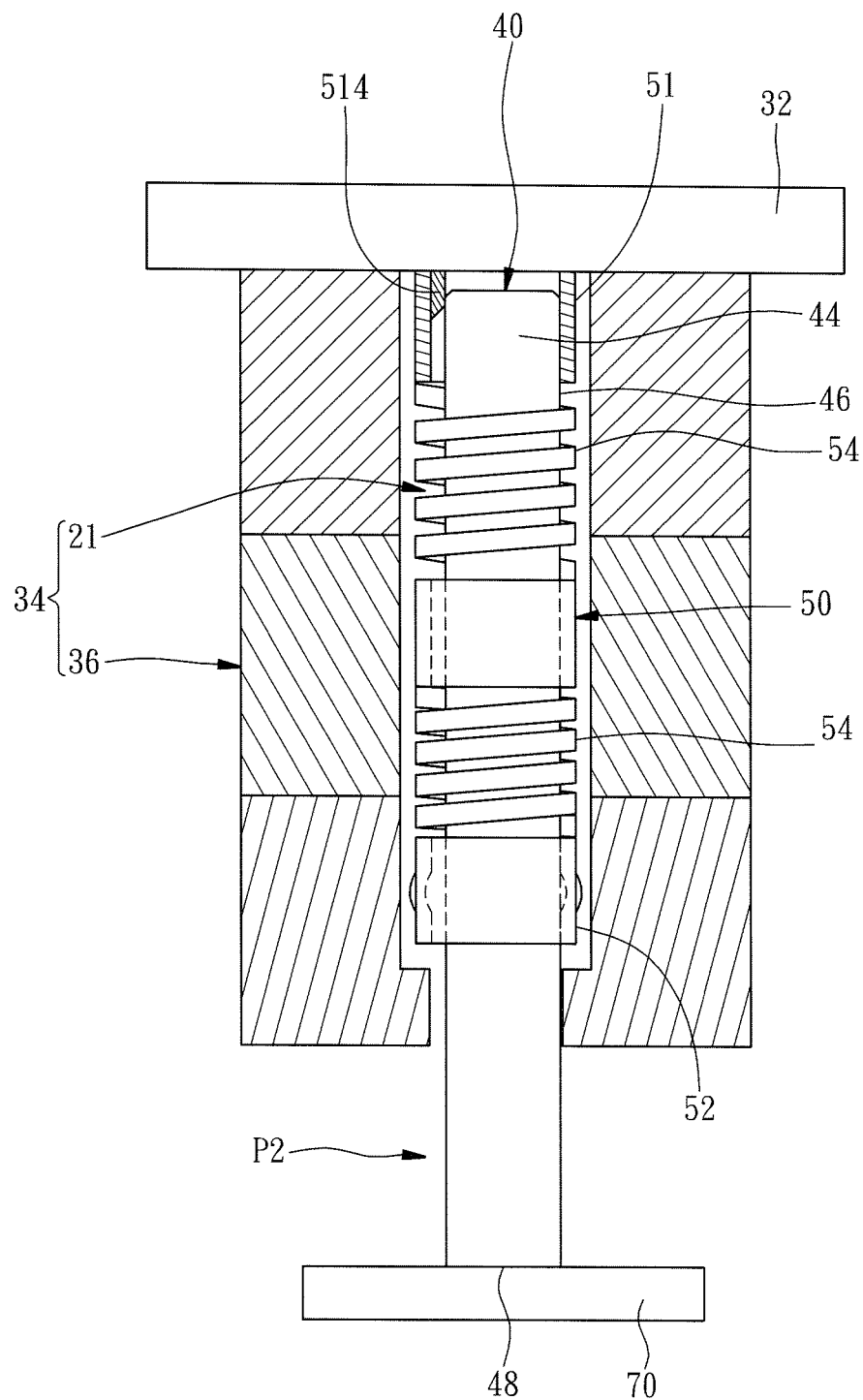
FIG. 6 is similar to FIG. 3, but showing another status that the needle of the spring probe is probing a DUT and located at a connected position.

The spring probe 21 is primarily adapted for being used in a probe card for probing a DUT 70 as shown in FIG. 6 by the bottom end 48 of the needle 40, thereby electrically connecting the DUT 70 with the circuit board 32. Alternately, the probe device 34 having the spring probe 21 may be mounted to a space transformer which is located between the circuit board 32 and the probe device 34. Alternately, the probe device 34 having the spring probe 21 may serve as an interposer for connecting two elements, such as a circuit board and a space transformer, for enabling contact pads of the two elements to be electrically connected with each other. In this embodiment, the bottom end 48 of the needle 40 is shaped as a plane, but may be shaped as an awl as shown in FIG. 2.

When the DUT 70 is probed by the needle 40, the needle 40 is forced to move upwards from an initial position P1 as shown in FIG. 3. Because the lower non-spring section 52 is fixed to the needle 40 and moved with the needle 40 synchronously, and the upper non-spring section 51 is abutted against the circuit board 32 and unmovable upwards, each spring section 54 is compressed when the needle 40 is moved upwards, and the needle 40 will be moved relative to the upper non-spring section 51 to a connected position P2 as shown in FIG. 6. When the needle 40 is located at the connected position P2, the protrusion 514 of the upper non-spring section 51 is abutted against the top end portion 44 of the needle 40. In this condition, the top end portion 44 of the needle 40 will not contact the circuit board 32.

As shown in FIG. 3, the protrusion 514 in this embodiment has a guiding slope 514a which is inclined relative to the inner surface 512 of the upper non-spring section 51 and faces the needle 40, and an engagement surface 514b which is parallel to and distanced from the inner surface 512 and faces the inner surface 512. Besides, the top end portion 44 of the needle 40 has a chamfering 442 facing the protrusion 514. In the process that the needle 40 is moved from the initial position P1 to the connected position P2, the chamfering 442 of the needle 40 will first contact the guiding slope 514a and then the needle 40 will move along the guiding slope 514a. When the needle 40 is located at the connected position P2, the outer circumferential surface 46 of the needle 40 is in contact with the engagement surface 514b and the inner surface 512. At this moment, a large area of the top end portion 44 of the needle 40 is in contact with the protrusion 514, so that the top end portion 44 of the needle 40 is electrically connected with the upper non-spring section 51 reliably, resulting in that the signals transmitted between the needle 40 and the spring sleeve 50 are mostly transmitted between the top end portion 44 and the upper non-spring section 51. Therefore, the spring probe 21 effectively prevents signals from being transmitted through the spring sections 54 of the spring sleeve 50, thereby improving the stability of signal transmission and preventing the spring sections 54 from fracture. Specifically speaking, because the spring sections 54 have small cross section area, they are unable to bear large electric current passing therethrough. If the spring sections 54 receive exceeding electric current and therefore too much heat is produced in the spring sections 54, the spring sections 54 are liable to be fractured. Therefore, the spring probe 21, which can prevent the signal current from flowing through the spring sections 54, effectively prevents the spring sections 54 from fracture. In addition, the spring sections 54 having relatively longer path for signal transmission have great inductance, resulting in that the transmitting bandwidth of the signals passing through the spring sections 54 can hardly be improved. However, the spring probe 21 can prevent the signal current from flowing through the spring sections 54; therefore, the spring probe 21 of the present invention is suitable for high frequency testing.

It is to be mentioned that the protrusion 514 of the upper non-spring section 51 is not limited to the above-disclosed configuration. For example, the protrusion 514 may have no such guiding slope 514a, and the needle 40 may have no such chamfering 442. Alternately, the protrusion 514 may be configured as the ones provided in the following two embodiments respectively. As long as the protrusion 514 is abutted against the top end portion 44 of the needle 40 when the needle 40 is located at the connected position P2, the top end portion 44 will be positively and electrically connected with the upper non-spring section 51, achieving high stability of signal transmission.

Besides, the insulated layer 60 is capable of preventing signals from being transmitted between the needle 40 and the lower non-spring section 52. Therefore, the insulated layer 60 can effectively prevent signals from being transmitted through the spring sections 54 of the spring sleeve 50 too, thereby improving the stability of signal transmission of the spring probe 21. In the case that the spring probe 21 has such insulated layer 60, even if the spring sleeve 50 has no such protrusion 514, the spring probe 21 still has higher stability of signal transmission than the conventional spring probe. In practice, the outer circumferential surface 46 of the needle 40 may be mostly covered by the insulated layer 60, except for the part of the outer circumferential surface 46 at the top end portion 44; alternately, the inner surfaces of the lower non-spring section 52, the middle non-spring section 53 and the spring sections 54 may be completely covered by the insulated layer 60. This means the insulated layer 60 is not limited to be provided only at the lower non-spring section 52 or the part of the needle 40, which corresponds in position to the lower non-spring section 52. Likewise, the insulated layer 60 can prevent the spring sections 54 having small cross section area from being overloaded with electric current, thereby preventing the spring sections 54 from fracture.

Figure 7:
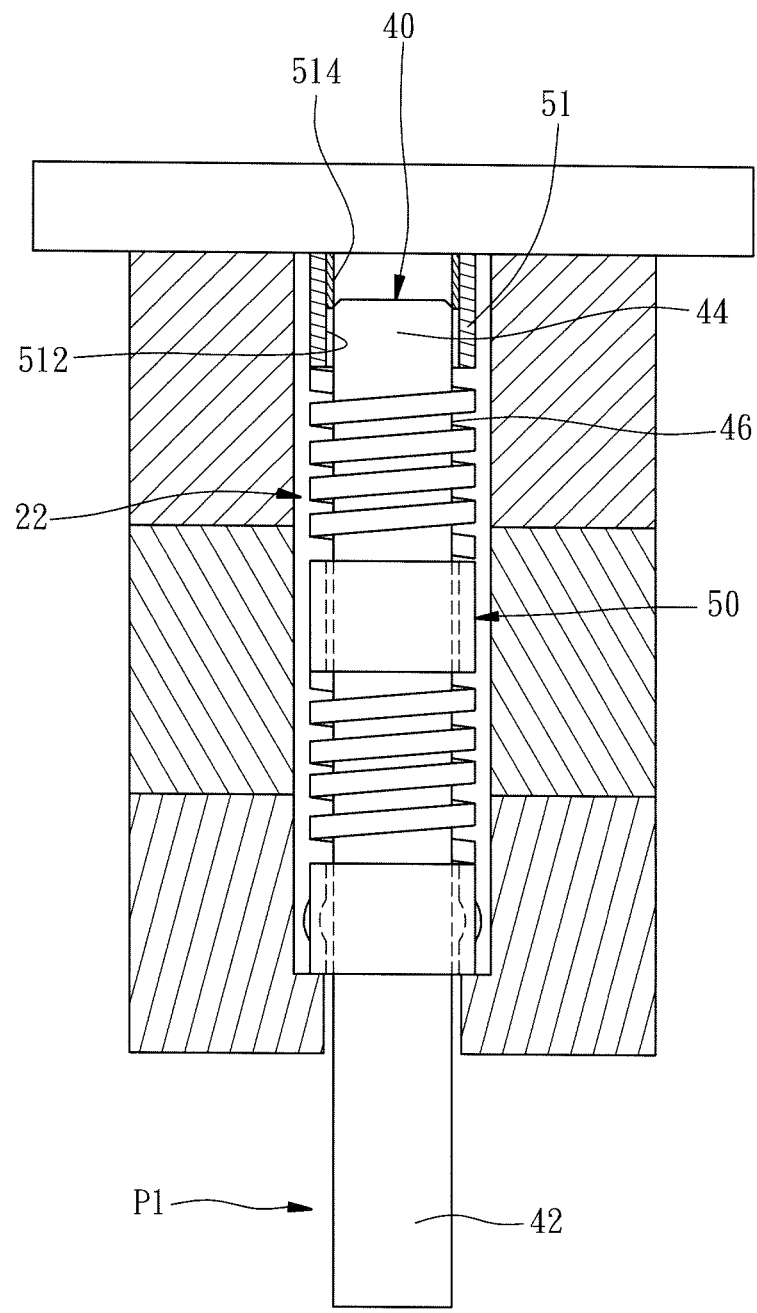
FIG. 7 is a schematic sectional view of a probe card having a spring probe according to a second preferred embodiment of the present invention, showing a status that a needle of the spring probe is located at an initial position.
Figure 8:
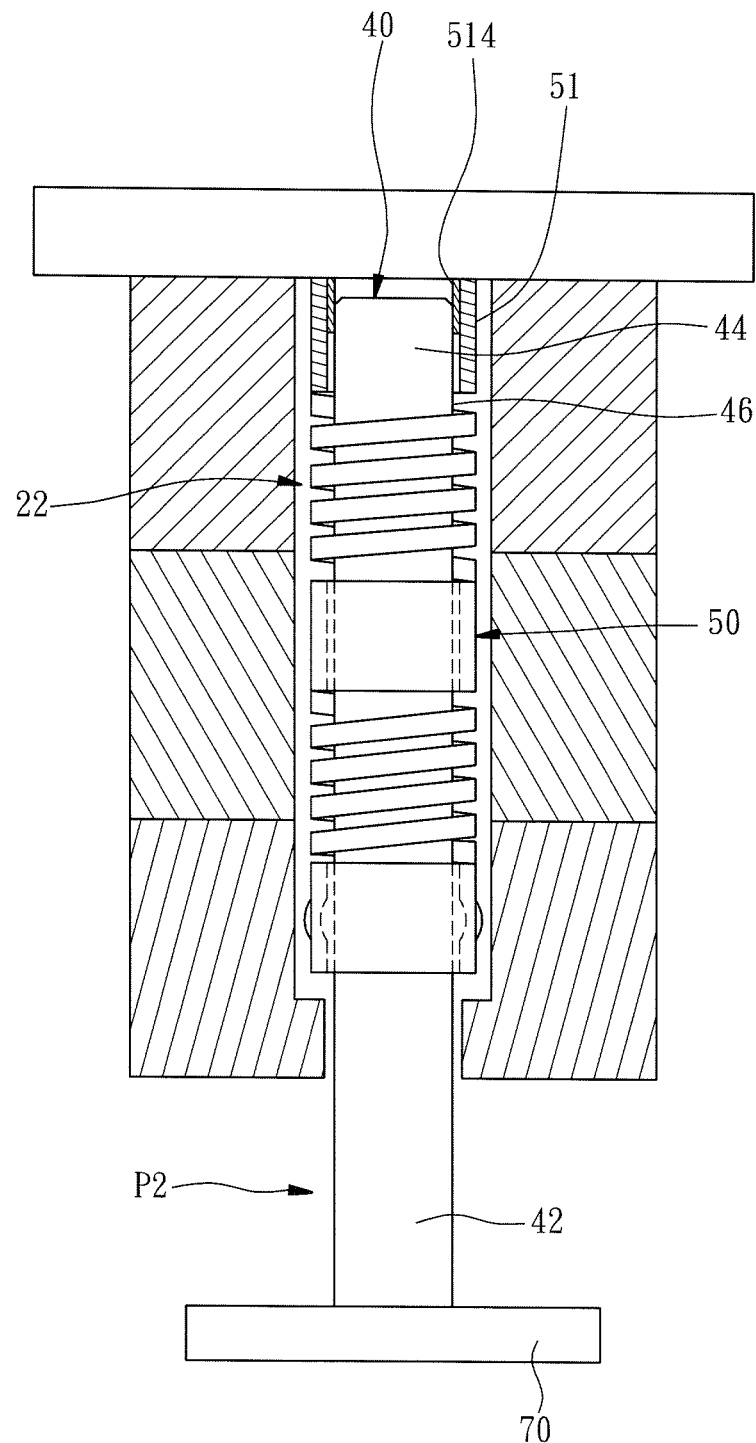
FIG. 8 is similar to FIG. 7, but showing another status that the needle of the spring probe is probing a DUT and located at a connected position.

Referring to FIG. 7, a spring probe 22 according to a second preferred embodiment of the present invention is similar to the spring probe 21 disclosed by the aforesaid first preferred embodiment, but different from the spring probe 21 in the shape of the protrusion 514 of the upper non-spring section 51. In this embodiment, the protrusion 514 is ring-shaped with an inner diameter approximately equal to the diameter of the needle 40. When the needle 40 is probing the DUT 70 and moved to the connected position P2 as shown in FIG. 8, the top end portion 44 of the needle 40 is surrounded by the protrusion 514, and the outer circumferential surface 46 of the needle 40 is in contact with the protrusion 514. In this way, when the needle 40 is located at the connected position P2, a large area thereof is in contact with the upper non-spring section 51, so that the spring probe 22 has high stability of signal transmission. As disclosed in this embodiment, the spring probe of the present invention may be configured in a way that the needle 40 is in contact with the protrusion 514 when located at the initial position P1.

Figure 9:
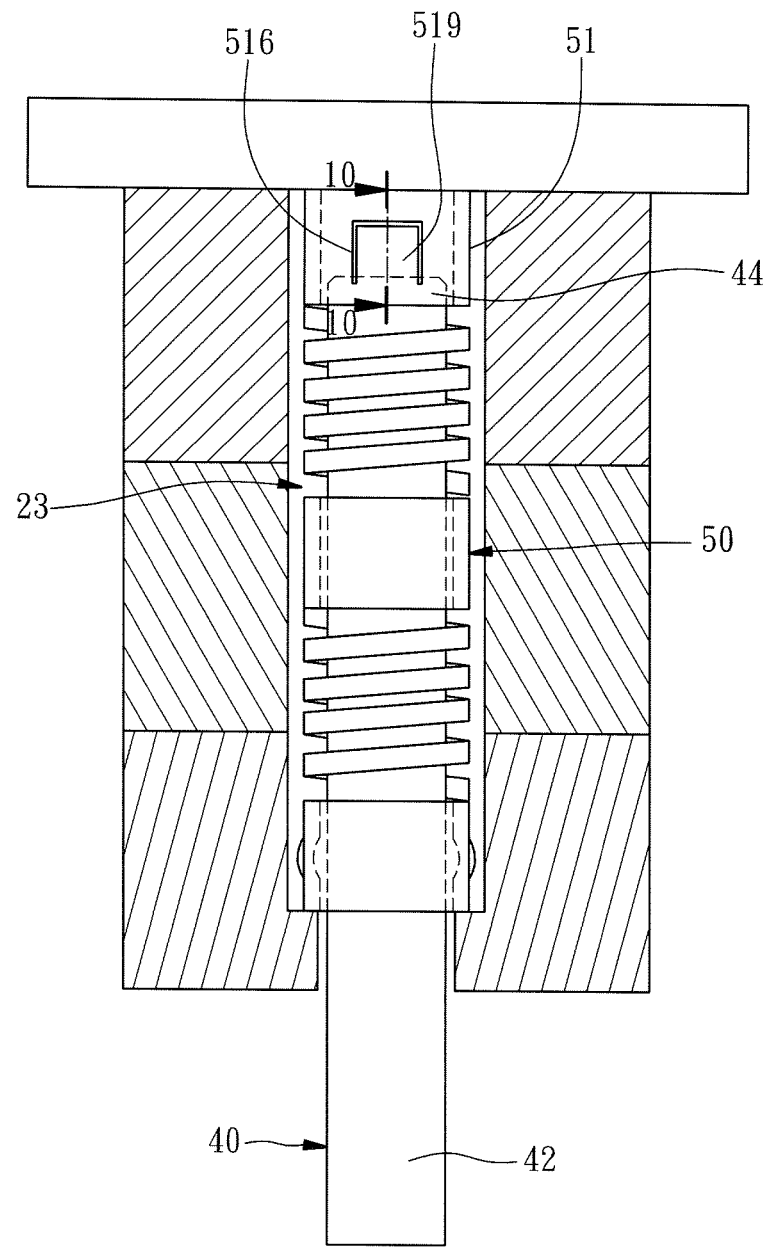
FIG. 9 is a schematic sectional view of a probe card having a spring probe according to a third preferred embodiment of the present invention.
Figure 10:
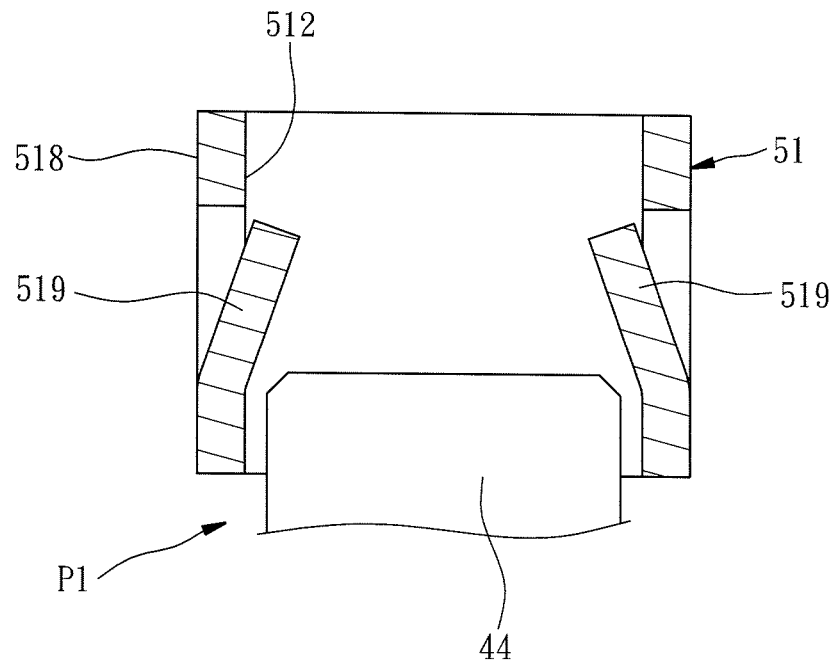
FIG. 10 is a sectional view taken along the line 10-10 in FIG. 9, showing a status that a needle of the spring probe is located at an initial position.
Figure 11:
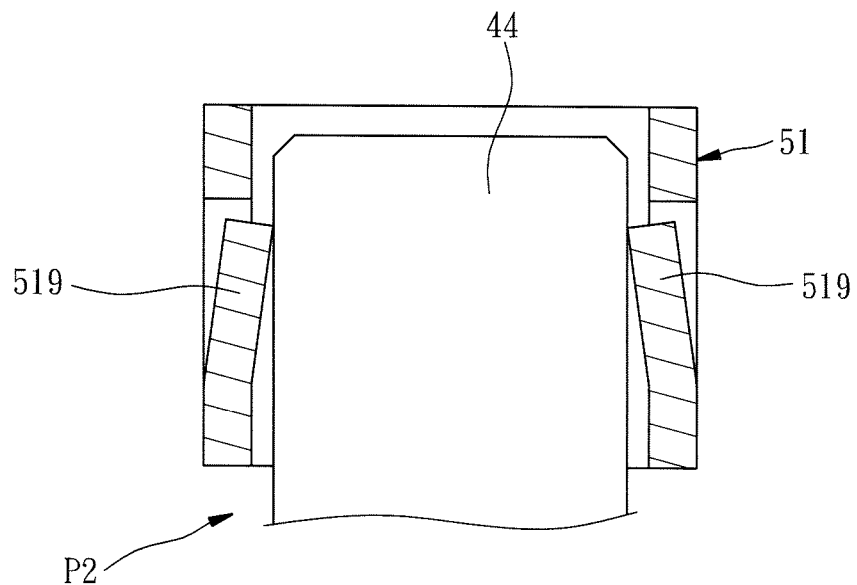
FIG. 11 is similar to FIG. 10, but showing another status that the needle of the spring probe is located at a connected position.

Referring to FIGS. 9-11, a spring probe 23 according to a third preferred embodiment of the present invention is different from the aforesaid two embodiments in the shape and manufacturing method of the protrusion of the upper non-spring section. In the manufacturing process of the spring sleeve 50 in this embodiment, the upper non-spring section 51 is provided with two inverted U-shaped grooves 516 penetrating through the inner surface 512 and an outer surface 518 by etching. In FIG. 9, only one of the grooves 516 is shown. Resulted from the grooves 516, the upper non-spring section 51 has two quadrangle-shaped elastic pieces 519. The amounts of the grooves 516 and the elastic pieces 519 are unlimited in actual design. The elastic pieces 519 are pressed by external force to extend into the upper non-spring section 51 to become the protrusions 519 protruded from the inner surface 512.

In the process that the needle 40 is moved from the initial position P1 to the connected position P2, the elastic pieces 519 are pushed by the top end portion 44 of the needle 40 to swing outwards. Therefore, when the needle 40 is located at the connected position P2, the elastic pieces 519 are forced by the rebounding elastic force thereof to be abutted against the top end portion 44. In this way, it is ensured that the top end portion 44 of the needle 40 can be positively and electrically connected with the upper non-spring section 51, thereby improving the stability of signal transmission of the spring probe 23. Besides, the spring probe 23 in this embodiment can be made more easily.

Figure 12:
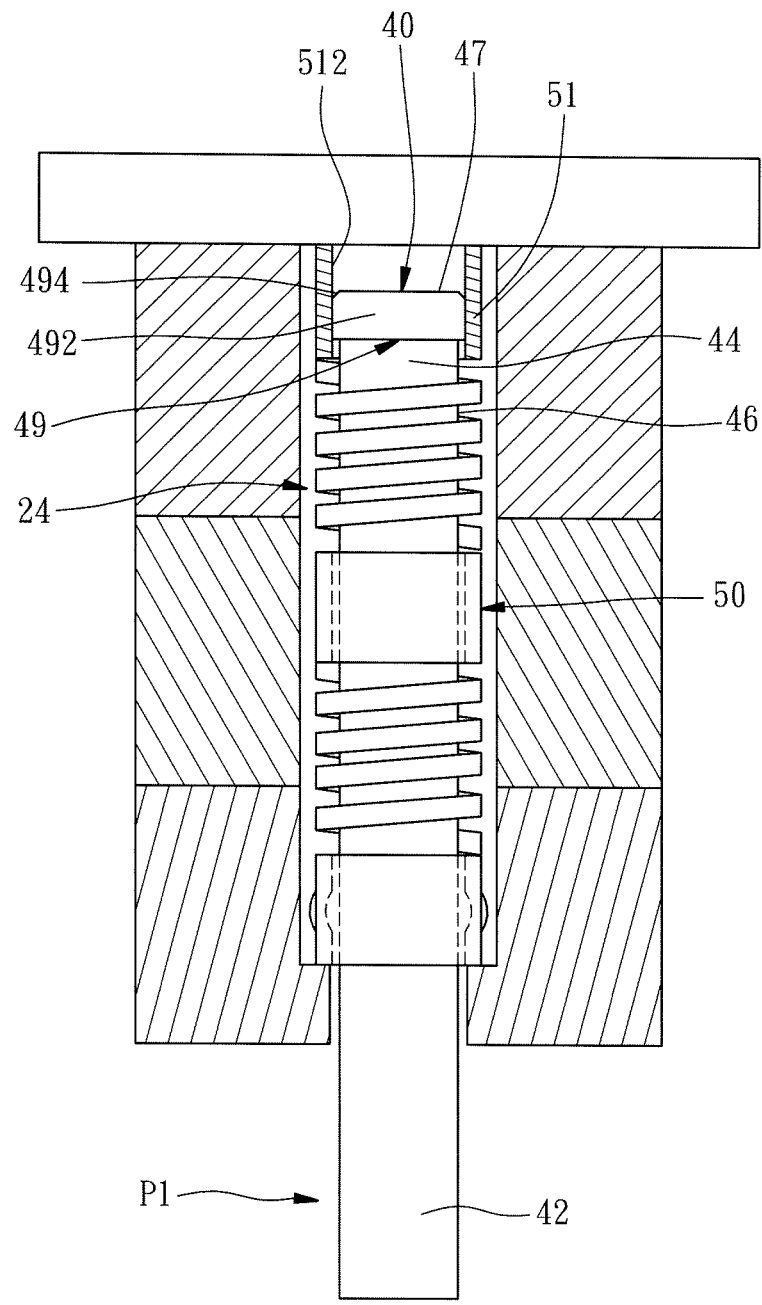
FIG. 12 is a schematic sectional view of a probe card having a spring probe according to a fourth preferred embodiment of the present invention.

Referring to FIG. 12, a spring probe 24 according to a fourth preferred embodiment of the present invention is different from the aforesaid embodiments in that the upper non-spring section 51 of the spring sleeve 50 has no such protrusion 514 but the top end portion 44 of the needle 40 has a protrusion 49. In this way, when the needle 40 is located at the connected position P2, the upper non-spring section 51 is electrically connected with the top end portion 44 of the needle 40 through the protrusion 49.

Specifically speaking, the protrusion 49 is fixed to the outer circumferential surface 46 of the needle 40, protruded from the outer circumferential surface 46, and provided with an engagement surface 492 facing the spring sleeve 50 and a guiding slope 494 connected with the engagement surface 492 and inclined relative to the engagement surface 492. Besides, the top surface of the protrusion 49 is flush with the top end 47 of the needle 40. Therefore, no matter the needle 40 is located at the initial position P1 or the connected position P2, the protrusion 49 is located in the upper non-spring section 51, the engagement surface 492 of the protrusion 49 is in contact with the inner surface 512 of the upper non-spring section 51, and the guiding slope 494 is located in the upper non-spring section 51. However, the spring probe 24 may be configured in a way that the top surface of the protrusion 49 is lower than the top end 47 of the needle 40, and may be arranged in a way that the protrusion 49 is located out of the upper non-spring section 51 when the needle 40 is located at the initial position P1. The protrusion 49 may be configured without such guiding slope 494. However, the guiding slope 494 can prevent the protrusion 49 from getting stuck when the protrusion 49 enters into the upper non-spring section 51. Besides, the protrusion 49 in this embodiment is ring-shaped and surrounds the top end portion 44 of the needle 40. In this way, a large area of the protrusion 49 is in contact with the upper non-spring section 51, so that the needle 40 is electrically connected with the upper non-spring section 51 reliably. However, the protrusion 49 is not limited to be ring-shaped.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A spring probe comprising:
    a needle having a top end portion and a bottom end portion;
    a spring sleeve sleeved onto the needle and provided with an upper non-spring section having an inner surface facing the needle, a lower non-spring section fixed to the needle, and at least one spring section located between the upper non-spring section and the lower non-spring section, the bottom end portion of the needle protruding out of the spring sleeve from the lower non-spring section, the top end portion of the needle being located in the upper non-spring section; and
    a protrusion located at one of the top end portion of the needle and the upper non-spring section of the spring sleeve;
    wherein the needle has an outer circumferential surface facing the spring sleeve; when the needle receives an external force, the needle is movable relative to the upper non-spring section of the spring sleeve from an initial position to a connected position where the inner surface of the upper non-spring section is electrically connected with the outer circumferential surface of the top end portion of the needle through the protrusion.

2. The spring probe as claimed in claim 1, wherein the protrusion is protruded from the inner surface of the upper non-spring section.

3. The spring probe as claimed in claim 2, wherein the protrusion has a guiding slope which is inclined relative to the inner surface of the upper non-spring section and faces the needle, such that the needle is moved along the guiding slope when the needle is moved from the initial position to the connected position.

4. The spring probe as claimed in claim 2, wherein the protrusion has an engagement surface which is distanced from the inner surface of the upper non-spring section and faces the inner surface; when the needle is located at the connected position, the outer circumferential surface of the needle is in contact with the engagement surface and the inner surface of the upper non-spring section.

5. The spring probe as claimed in claim 2, wherein the protrusion is ring-shaped; when the needle is located at the connected position, the protrusion surrounds the top end portion of the needle and contacts the outer circumferential surface of the needle.

6. The spring probe as claimed in claim 2, wherein the top end portion of the needle has a chamfering facing the protrusion.

7. The spring probe as claimed in claim 2, wherein the upper non-spring section has a groove penetrating through the inner surface and an outer surface of the upper non-spring section, and an elastic piece resulted from the groove and extended into the upper non-spring section to serve as the protrusion.

8. The spring probe as claimed in claim 1, wherein the protrusion is protruded from the outer circumferential surface of the needle.

9. The spring probe as claimed in claim 8, wherein the protrusion has an engagement surface facing the spring sleeve, and a guiding slope connected with the engagement surface and inclined relative to the engagement surface; when the needle is located at the connected position, the engagement surface of the protrusion is in contact with the inner surface of the upper non-spring section and the guiding slope is located in the upper non-spring section.

10. The spring probe as claimed in claim 8, wherein the top end portion of the needle is surrounded by the protrusion.

11. The spring probe as claimed in claim 1, further comprising an insulated layer located between the lower non-spring section of the spring sleeve and the needle; wherein the insulated layer is provided at one of the outer circumferential surface of the needle and an inner surface of the lower non-spring section; the inner surface of the lower non-spring section faces the needle.

12. A spring probe comprising:
    a needle having a top end portion and a bottom end portion;
    a spring sleeve sleeved onto the needle and provided with an upper non-spring section, a lower non-spring section fixed to the needle, and at least one spring section located between the upper non-spring section and the lower non-spring section, the bottom end portion of the needle protruding out of the spring sleeve from the lower non-spring section, the top end portion of the needle being located in the upper non-spring section; and
    an insulated layer provided at an outer circumferential surface of the needle, except a part of the outer circumferential surface that is located at the top end portion of the needle;
    wherein the outer circumferential surface of the needle faces the spring sleeve.

13. A spring probe comprising:
    a needle having a top end portion and a bottom end portion;
    a spring sleeve sleeved onto the needle and provided with an upper non-spring section, a lower non-spring section fixed to the needle, and at least one spring section located between the upper non-spring section and the lower non-spring section, the bottom end portion of the needle protruding out of the spring sleeve from the lower non-spring section, the top end portion of the needle being located in the upper non-spring section; and
    an insulated layer provided at an inner surface of the lower non-spring section, which faces the needle.

* * * * *